(12) United States Patent
Asakura et al.

(10) Patent No.: US 12,261,412 B2
(45) Date of Patent: Mar. 25, 2025

(54) ELECTRO-ABSORPTION MODULATOR

(71) Applicant: Lumentum Japan, Inc., Kanagawa (JP)

(72) Inventors: Hideaki Asakura, Kanagawa (JP); Atsushi Nakamura, Nagano (JP); Hayato Takita, Kanagawa (JP); Shunya Yamauchi, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 483 days.

(21) Appl. No.: 17/645,177

(22) Filed: Dec. 20, 2021

(65) Prior Publication Data

US 2023/0006414 A1    Jan. 5, 2023

(30) Foreign Application Priority Data

Jun. 30, 2021  (JP) ................................ 2021-108430
Sep. 8, 2021  (JP) ................................ 2021-145938

(51) Int. Cl.
*H01S 5/026* (2006.01)
*G02F 1/015* (2006.01)
(Continued)

(52) U.S. Cl.
CPC .......... *H01S 5/0265* (2013.01); *G02F 1/0157* (2021.01); *G02F 1/01708* (2013.01);
(Continued)

(58) Field of Classification Search
CPC .................................................... G02F 1/0157
(Continued)

(56) References Cited

U.S. PATENT DOCUMENTS

| 2005/0275920 | A1 | 12/2005 | Sumi et al. | |
| 2016/0365929 | A1* | 12/2016 | Nakamura | ................ H01S 5/12 |
| 2016/0370609 | A1* | 12/2016 | Nakamura | .......... G02F 1/01708 |

FOREIGN PATENT DOCUMENTS

| JP | 2005352219 A | 12/2005 |
| JP | 2009-222965 A | 10/2009 |
| JP | 2014-145973 A | 8/2014 |

OTHER PUBLICATIONS

Tatemi Ido, et al.; "Ultra-High-Speed Multiple-Quantum-Well Electro-Absorption Optical Modulators with Integrated Waveguides"; Journal of Lightwave Technology; vol. 14, No. 9; pp. 2026-2034; Sep. 1996; IEEE.

(Continued)

*Primary Examiner* — Tuan N Nguyen
(74) *Attorney, Agent, or Firm* — Harrity & Harrity, LLP

(57) ABSTRACT

Provided is an electro-absorption modulator that includes a substrate, a mesa structure, a first conductivity type electrode, and a second conductivity type electrode. The first conductivity type electrode includes a mesa-top electrode, a pad electrode, and a lead-out wire electrode. The mesa structure has a light input end, to which light is to be input from outside, and a light output end, which is on a side of the mesa structure that is opposite of the light input end. A connection position between a center position in a short-side direction of the lead-out wire electrode and the mesa-top electrode is closer to the light output end side in a long-side direction of the mesa-top electrode. The connection position is a position that is less than 50% from the light output end side with respect to a length in the long-side direction of the mesa-top electrode.

11 Claims, 14 Drawing Sheets

(51) Int. Cl.
 *G02F 1/017* (2006.01)
 *G02F 1/025* (2006.01)
 *H01S 5/227* (2006.01)
 *H01S 5/343* (2006.01)

(52) U.S. Cl.
 CPC ............. *G02F 1/025* (2013.01); *H01S 5/227* (2013.01); *H01S 5/343* (2013.01)

(58) Field of Classification Search
 USPC .......................................................... 372/2
 See application file for complete search history.

(56) References Cited

OTHER PUBLICATIONS

Richard Sahara, et al.; "Strongly Improved Frequency Response at High-Optical Input Powers from InGaAsP Compensated Strain MQW Electroabsorption Modulators," IEEE Photonics Technology Letters; vol. 7, No. 9; pp. 1004-1006; Sep. 1995; IEEE.
Ramdane, A., et al., "Monolithic Integration of Multiple-Well Lasers and Modulators for High Speed Transmission," IEEE Journal of Selected Topics in Quantum Electronics—p. 335, vol. 2(2), pp. 326-335, Jun. 1996.

* cited by examiner

ELECTRO-ABSORPTION MODULATOR

CROSS-REFERENCE TO RELATED APPLICATIONS

The present application claims priority from Japanese patent applications JP2021-145938 filed on Sep. 8, 2021 and JP2021-108430 filed on Jun. 30, 2021, the contents of which are hereby expressly incorporated by reference herein.

TECHNICAL FIELD

The present invention relates to an electro-absorption modulator, in particular, shapes of electrodes.

BACKGROUND

Light modulation technologies are used in many applications, such as optical fiber communication, free-space optical communication, and information processing using optical pulses. Accordingly, compact optical modulators capable of high-speed response are highly sought-after. One of such optical modulators is an electro-absorption (EA) modulator that utilizes an electro-absorption effect in semiconductors. The EA modulator has a p-i-n structure with a multiple quantum well layer as an i-layer, and voltage can be applied to the p-i-n structure to perform optical intensity modulation. Typically, an EA modulator includes, for example, an InP substrate and has a multiple quantum well layer formed of InGaAsP. In another example, an EA modulator includes an Si-based structure and has an i-layer formed of SiGe. Further, an EA modulator is often used as an optical semiconductor device integrally integrated with a semiconductor laser.

In some cases, a p-side electrode of an EA modulator is formed of a mesa-top electrode along a mesa, a pad electrode (to which a wire connected from the outside is bonded), and a lead-out wire electrode that connects the pad electrode and the mesa-top electrode. In some cases, carriers (photo current), generated by an EA modulator that absorbs light, have a distribution in a direction along the mesa of the EA modulator. Further, a structure in which, in order to increase a heat dissipation property at such a time, a connection portion between a lead-out wire electrode and a mesa-top electrode is provided on a light input end side.

SUMMARY

A prime factor in a reduction in response time in an EA modulator is an electrostatic capacitance of the EA modulator. Further, a response time can be improved by reducing a modulator length. However, when a length of the EA modulator is reduced, a total amount of light absorption is reduced and an extinction ratio is reduced, which may increase a communication error ratio of an optical transmission of the EA modulator. Thus, in order to obtain a high extinction ratio in an EA modulator having a short modulator length, a light absorption amount per unit length needs to increase. However, an increase in a light absorption amount leads to an increase in carriers (photogenerated carriers) generated in the EA modulator. There is no problem when the generated photogenerated carriers are satisfactorily extracted from the EA modulator, but there are cases in which the photogenerated carriers are not extracted satisfactorily. In those cases, the carriers remain in the EA modulator, usually in a multiple quantum well layer of the EA modulator. As a result, carrier pileup in the multiple quantum well layer occurs. The carrier pileup leads to reductions in characteristics of the EA modulator, such as extinction characteristics and response time. Extinction characteristics and response time are reduced based on an intensity of light input to the EA modulator and a light absorption amount of the EA modulator.

Further, a light input side of an EA modulator has a large amount of photo current as compared to a light output side. When a substantially constant voltage is applied with respect to an optical axis direction of the EA modulator, a distribution of the photo current shows a distribution tendency of the photogenerated carriers. In other words, a large amount of carriers should be extracted from a multiple quantum well of the EA modulator on the light input side as compared to the light output side. Even if the carriers are satisfactorily extracted when the voltage applied to the EA modulator is a direct current, or has a low speed of less than a kilohertz (kHz), the carriers may not be extracted when an alternating voltage of a gigahertz (GHz) or more is applied. When the carriers are not extracted at high speed, extinction characteristics and frequency characteristics, such as bandwidth, are reduced. This effect is significant when a light absorption amount per unit length is large, for example, in a short EA modulator or at a high temperature at which light absorption is increased.

The present disclosure has been made in view of the above-mentioned problems, and therefore provides an electro-absorption modulator with improved high-speed responsivity.

In some implementations, an electro-absorption modulator (EA modulator), includes: a substrate; a mesa structure, which is provided on a first surface of the substrate, and includes a first conductivity type cladding layer, a multiple quantum well layer, and a second conductivity type cladding layer; a first conductivity type electrode to be electrically connected to the first conductivity type cladding layer; and a second conductivity type electrode provided on a second surface of the substrate. The first conductivity type electrode includes a mesa-top electrode arranged along a direction in which the mesa structure extends, a pad electrode, to which an electric signal from an outside source is to be input, and a lead-out wire electrode, which connects the mesa-top electrode and the pad electrode. The mesa structure has a light input end, to which light is to be input from the outside, and a light output end, which is on a side of the mesa structure that is opposite of the light input end. A connection position between a center position in a short-side direction of the lead-out wire electrode and the mesa-top electrode is closer to the light output end side in a long-side direction of the mesa-top electrode. The connection position is a position that is less than 50% away from the light output end side with respect to a length in the long-side direction of the mesa-top electrode.

DETAILED DESCRIPTION

Figure 1:
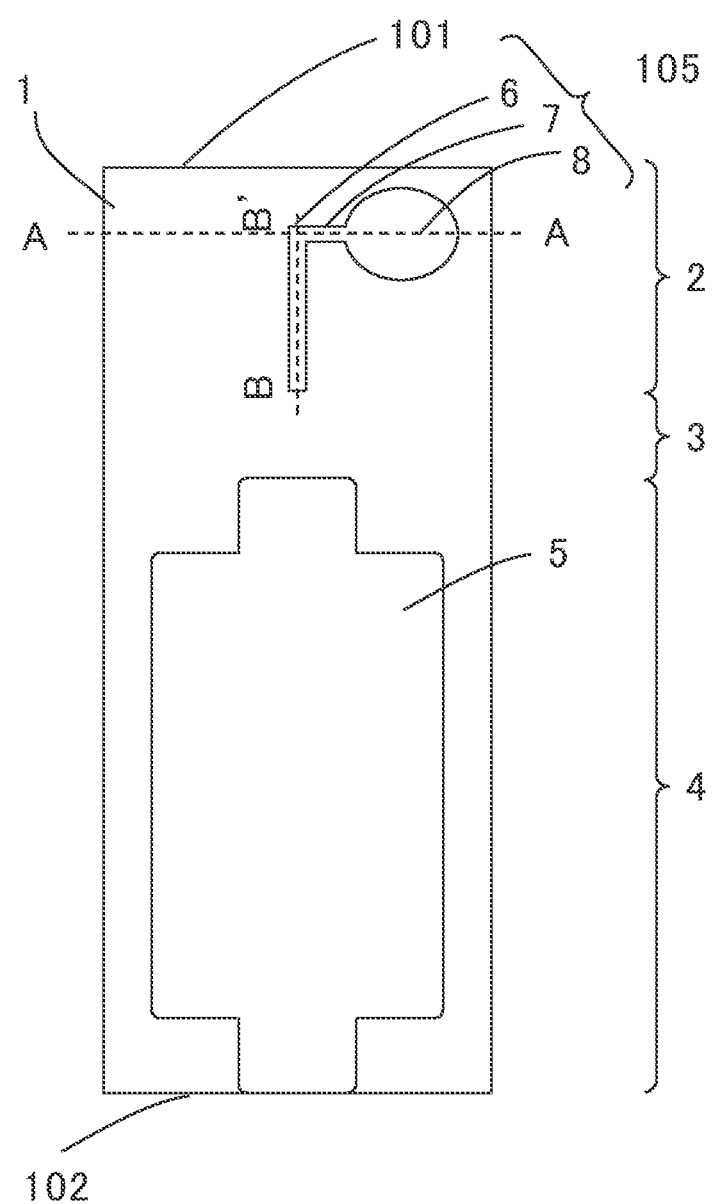
FIG. 1 is a top view of an electro-absorption modulator integrated laser in a first example implementation of the present disclosure.

Some implementations are specifically described in detail in the following with reference to drawings. In the drawings, the same members are denoted by the same reference numerals and have the same or equivalent functions, and a repetitive description thereof is omitted for the sake of simplicity. Note that, the drawings referred to in the following are only for illustrating the example implementations, and are not necessarily drawn to scale.

FIG. 1 is a top view of an electro-absorption modulator integrated laser 1 in a first example implementation of the present disclosure. The electro-absorption modulator integrated laser 1 may be a semiconductor integrated device in which an electro-absorption (EA) modulator 2, a waveguide connection portion 3, and a semiconductor laser 4 are integrated on a common substrate. The electro-absorption modulator integrated laser 1 may be an integrated device in which the semiconductor laser 4, the waveguide connection portion 3, and the EA modulator 2 are optically connected to each other in the stated order. The semiconductor laser 4 may emit continuous light, and the waveguide connection portion 3 may transfer the light emitted from the semiconductor laser 4 to the EA modulator 2. The EA modulator 2 includes a multiple quantum well layer 10, which may absorb light corresponding to an oscillation wavelength of the semiconductor laser 4. The continuous light that has passed the waveguide connection portion 3 and has entered the EA modulator 2 may be intensity-modulated by the EA modulator 2 to be converted into a 2-, 4-, or other-level modulated optical signal. The modulated optical signal output from the EA modulator 2 may be emitted from a front facet 101. On the front facet 101, a dielectric anti-reflection film (not shown) may be formed. Further, on a back facet 102, which may be a facet at an opposite side of the semiconductor laser 4, a dielectric high-reflection film (not shown) may be formed. An example of the integrated type is described in the first example implementation, but effects of the disclosure can be obtained even when the present disclosure is applied to the EA modulator alone.

The semiconductor laser 4 may be a distributed feedback (DFB) laser that oscillates in a 1.3-μm band oscillation wavelength, for example. The oscillation wavelength may be a 1.55-μm band or other wavebands. Further, in some implementations, the semiconductor laser 4 may be a Fabry-Perot (FP) laser, a distributed Bragg reflector (DBR) laser, or a distributed reflector (DR) laser. The semiconductor laser 4 may include a semiconductor laser p-side electrode 5 (a first conductivity type electrode) to apply a voltage. The semiconductor laser 4 may inject an electric current between an n-side electrode 14 (a second conductivity type electrode), which is described elsewhere herein, and the semiconductor laser p-side electrode 5, to oscillate the continuous light.

Figure 2:
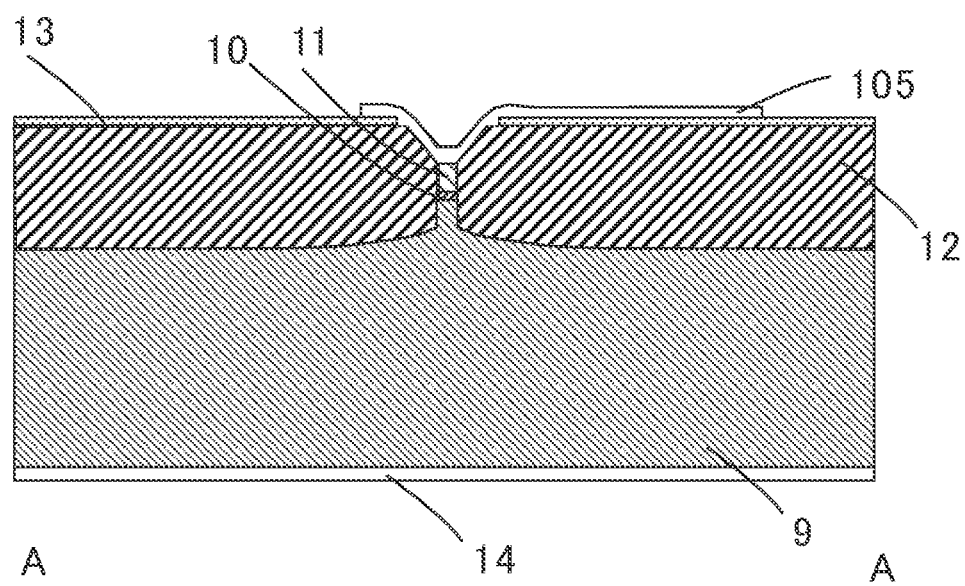
FIG. 2 is a cross-sectional view taken along the line A-A of an electro-absorption modulator illustrated in FIG. 1.

The EA modulator 2 may include an EA modulator p-side electrode 105. FIG. 2 is a schematic cross-sectional view taken along the line A-A shown in FIG. 1 that is perpendicular to an optical axis of the EA modulator 2. A mesa structure may be provided on an n-type InP (n-InP) substrate 9, and a semi-insulating InP buried layer 12 may be arranged on both sides of the mesa structure. The mesa structure may have a structure in which a part of the n-InP substrate 9, the i-type multiple quantum well layer 10, and a p-type InP cladding layer 11 are laminated in the stated order from the bottom. Those layers may form a p-i-n structure. Although not shown, an n-type optical confinement layer may be arranged between the multiple quantum well layer 10 and the n-InP substrate 9. Similarly, a p-type optical confinement layer may be arranged between an upper side of the multiple quantum well layer 10 and the p-type InP cladding layer 11. Further, although not shown, a p-type contact layer may be arranged on the p-type InP cladding layer 11. On an upper surface of the buried layer 12, a passivation film 13 may be arranged. Still further, the EA modulator p-side electrode 105 may be in contact with the p-type contact layer (not shown) so that a voltage can be applied to the p-i-n structure. On a surface of the n-InP substrate 9 that may be opposite to the surface on which the mesa structure may be formed, the n-side electrode 14 may be arranged. The n-side electrode 14 may be connected to a GND potential. As illustrated in FIG. 1, the EA modulator p-side electrode 105 may be formed of a mesa-top electrode 6 provided along the mesa structure, a pad electrode 8, to which electrical conduction means (for example, a wire) from the outside may be connected, and a lead-out wire electrode 7 connecting the mesa-top electrode 6 and the pad electrode 8. An electric signal from the outside may be input to the pad electrode 8, and the electric signal may be input to the mesa-top electrode 6 via the lead-out wire electrode 7. The electrodes forming the EA modulator p-side electrode 105 may be integrally provided, and all have the same configuration. The EA modulator p-side electrode 105 is formed of three layers of Ti/Pt/Au from the p-type contact layer side. In this example, the lead-out wire electrode 7 may be connected to a front end on a light output end side of the mesa-top electrode 6.

The multiple quantum well layer 10 may be provided in a region up to an end portion on the light output end side of the mesa-top electrode 6, and a waveguide having a mesa structure (not shown) may be provided from the end portion to the front facet 101. Instead of the waveguide having the mesa structure, a window structure without the mesa structure may be provided.

Figure 3:
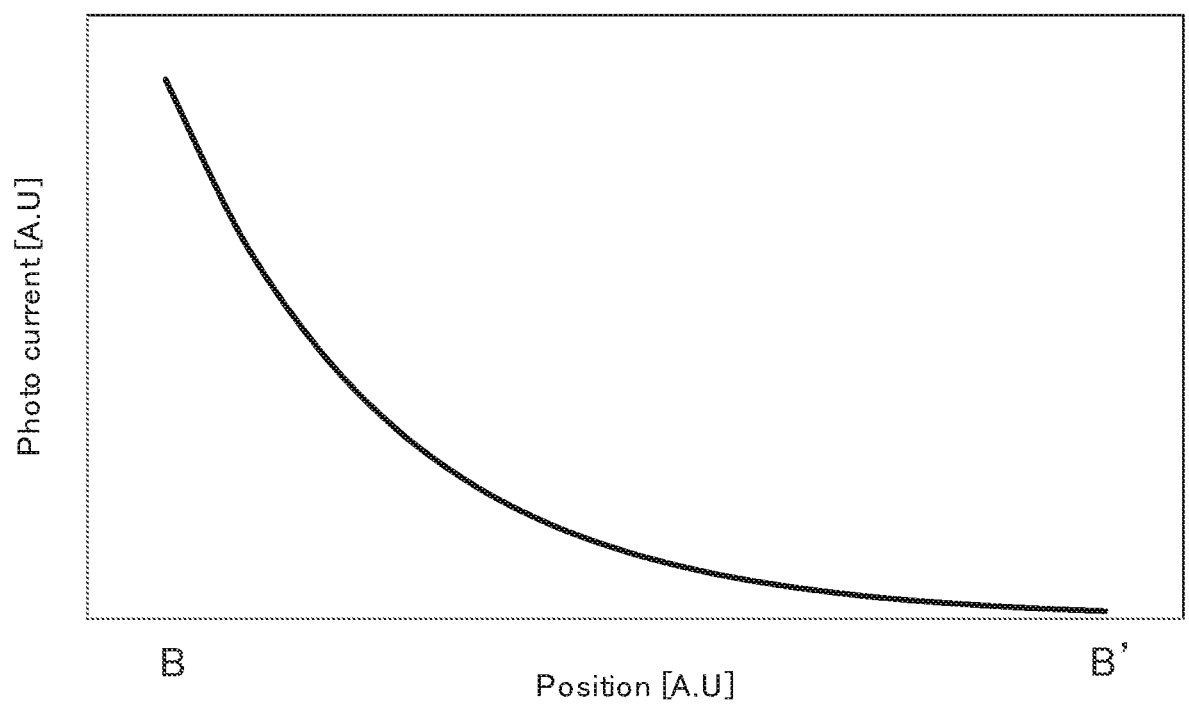
FIG. 3 is a graph showing a distribution in an optical axis direction of a photo current of the electro-absorption modulator illustrated in FIG. 1.

FIG. 3 shows a distribution in an optical axis direction of a photo current generated when the EA modulator 2 absorbs light. The photo current indicates an electric current that flows when a reverse bias is applied to the EA modulator 2 under a state in which output light of the semiconductor laser 4 is transferred to the EA modulator 2. A magnitude of the photo current may be substantially proportional to a light absorption amount in the EA modulator 2. In other words, the left side of FIG. 3 indicates the semiconductor laser 4 side, and the right side of FIG. 3 indicates the front facet 101 side. The photo current is large on the position B side, that is, the semiconductor laser 4 side. This indirectly indicates that a large amount of photogenerated carriers are generated on a light input end side. The photo current may be reduced from a light input end toward the light output end. In other words, a photo current distribution may be not constant in the optical axis direction in the EA modulator 2. The photo current may be proportional not only to an intensity of input light, but also to a magnitude of a voltage applied to the EA modulator 2. As the voltage applied to the EA modulator 2 becomes larger, the photo current increases. The voltage applied to the EA modulator 2 may be applied to the pad electrode 8 via the electrical conduction means from the outside. The voltage applied to the pad electrode 8 may be conveyed to the mesa-top electrode 6 via the lead-out wire electrode 7. Then, the voltage may be conveyed from the mesa-top electrode 6 to the p-type contact layer and the p-type InP cladding layer 11 to be applied to the multiple quantum well layer 10.

An electric field strength in a direction along an optical axis of the mesa structure may be constant when the voltage is applied is a constant, DC voltage. When a high-speed AC signal is applied, the electric field strength in the direction along the optical axis of the mesa structure may not be constant.

Figure 4:
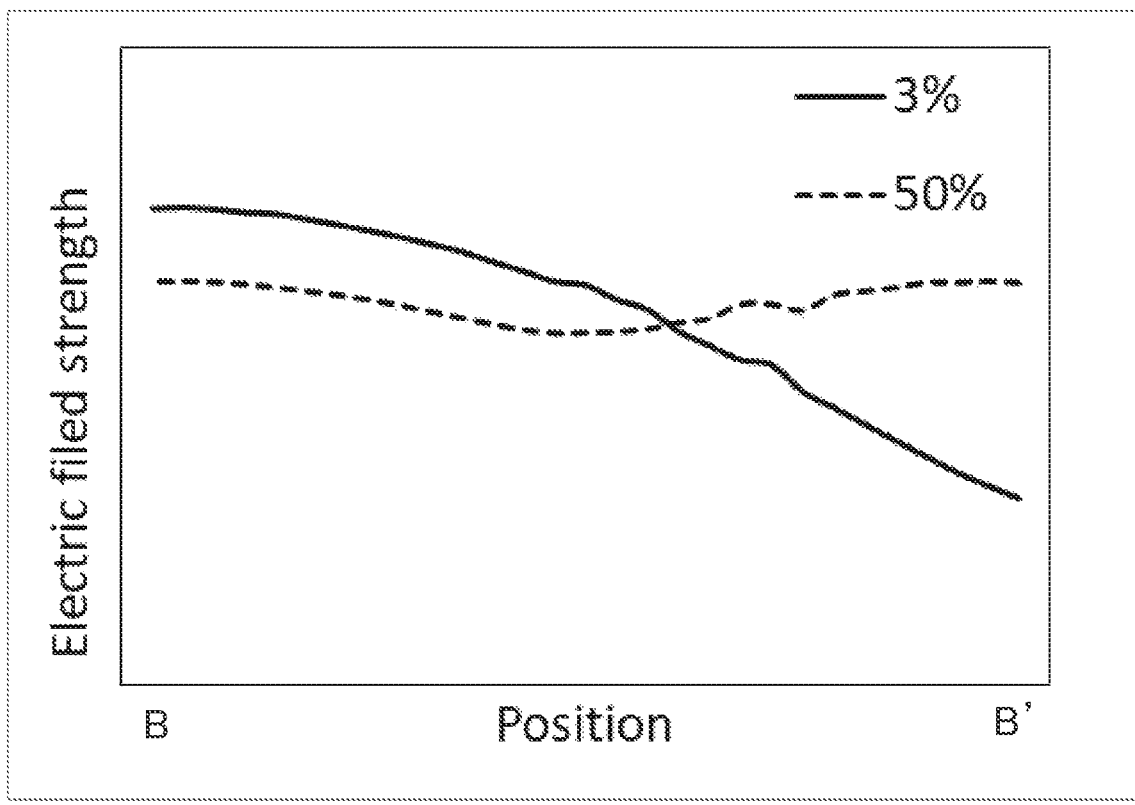
FIG. 4 is a graph showing an electric field strength of a multiple quantum well layer of the electro-absorption modulator illustrated in FIG. 1.

FIG. 4 is a graph showing an electric field strength distribution of the multiple quantum well layer 10 at the B-B' cross section of the EA modulator 2 shown in FIG. 1, which is determined using an electromagnetic field analysis. For a first analysis example, a length of the mesa-top electrode 6 is 150 µm, and a width) in a direction along an optical axis of the lead-out wire electrode 7 is 10 µm. A center position of the lead-out wire electrode 7 corresponds to a position within 3% of the light output end side (B' side) in a length direction in view of the entire mesa-top electrode 6. In a second analysis example, a center position of the lead-out wire electrode 7 corresponds to a center position of the mesa-top electrode 6. In the case of the structure in which the center positions match, the center position of the lead-out wire electrode 7 is at a position of 50% from the light output end side (B' side) of a long-side direction in view of the entire mesa-top electrode 6. A connection position of the lead-out wire electrode 7 is hereinafter represented as the position of 3%, the position of 50%, or the like using a percentage from the light output end side to the center position of the lead-out wire electrode 7.

FIG. 4 shows results obtained when a high-frequency electric signal of 40 GHz is applied to the pad electrode 8. In this example, the length of the mesa-top electrode 6 and a length of the multiple quantum well layer 10 are the same. The solid line indicates an electric field strength distribution in the first analysis example (position of 3%), and the dotted line indicates an electric field strength distribution in the second analysis example (position of 50%). As shown in FIG. 4, as compared to the case of the second analysis example, in which the electric field strength may be substantially constant at any position, the electric field strength of the EA modulator 2 in the first analysis example takes a different value depending on the position. Specifically, the electric field strength may be larger than the electric field strength of the second analysis example on the light input end side (B side), and may be smaller than the electric field strength of the second analysis example on the light output end side (B' side). The distribution generated in the electric field strength results from the fact that the connection position between the lead-out wire electrode 7 and the mesa-top electrode 6 may be on the light output end side (B' side). The high-frequency electric signal applied to the pad electrode 8 may be conveyed through the lead-out wire electrode 7, and may be transferred to the mesa-top electrode 6. The electric signal applied to the mesa-top electrode 6 may be transferred to the mesa-top electrode 6, and may be transferred to the multiple quantum well layer 10 via the p-type contact layer. Accordingly, when viewed from a contact point between the mesa-top electrode 6 and the lead-out wire electrode 7, the mesa-top electrode 6 electrically operates as an open stub. As a result, it is assumed that the distribution is generated in the electric field strength on the mesa-top electrode 6. A strong electric field can be applied to the light input end side, on which the photo current (that is, the photogenerated carriers) may be large. Further, the electric field strength may be reduced gradually from the light input end side toward the light output end side. However, the amount of photogenerated carriers (amount of photo current) may be similarly reduced. With the amount of carriers to be extracted being small, even when the electric field strength becomes small, the carriers can be extracted satisfactorily, and the carrier pileup rarely occurs. As a result, the carrier pileup can be suppressed in the entire EA modulator 2. As the applied voltage becomes larger, more photogenerated carriers can be extracted from the multiple quantum well layer 10, and hence the EA modulator 2 according to the first example implementation provides a structure with excellent extractability. With the excellent carrier extractability, the EA modulator 2 has excellent extinction characteristics and high-frequency characteristics, and therefore minimization and/or suppression of the carrier pileup is provided.

Figure 5:
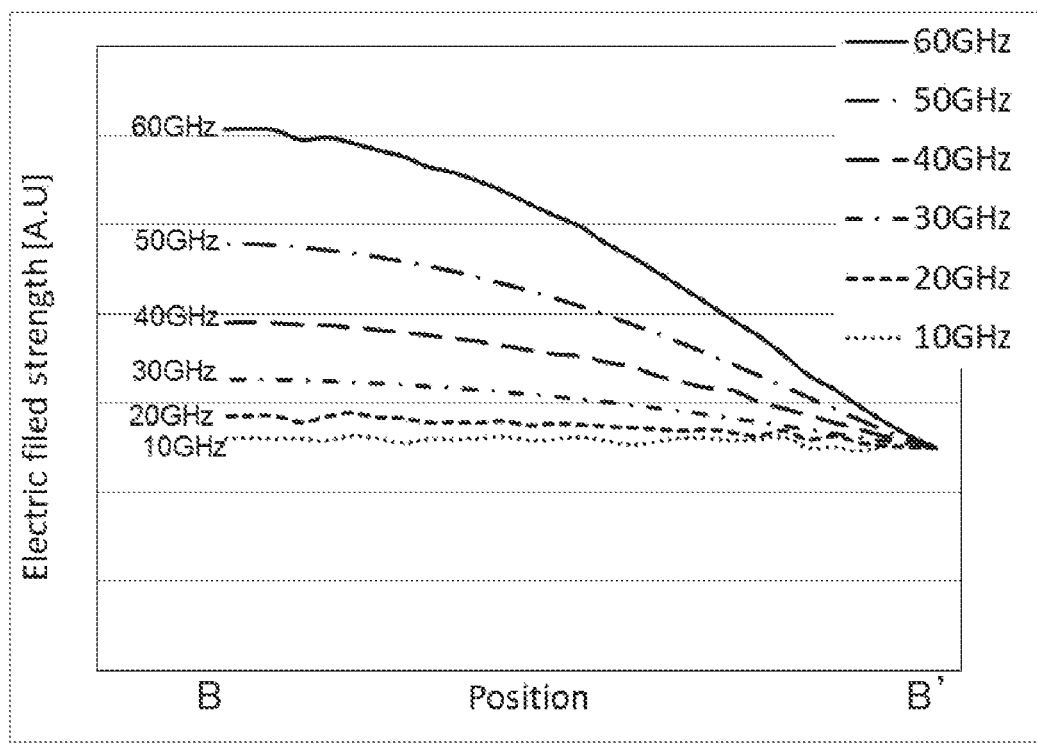
FIG. 5 is a graph showing the electric field strength of the multiple quantum well layer of the electro-absorption modulator illustrated in FIG. 1.

FIG. 5 shows the electric field strength of the EA modulator 2 when high-frequency electric signals of from 10 GHz to 60 GHz are applied to the pad electrode 8. Absolute values of the electric field strength are changed depending on the frequency, and hence are each standardized using the position of B' as a reference. At 10 GHz, the electric field strength is not greatly changed between the positions of the light input end side B and the light output end side B'. However, as the frequency becomes higher, the electric field strength on the light input end side B becomes larger with respect to the light output end side B'. In other words, it can be seen that effects obtained by applying a stronger electric field to the light input end side B having a larger photo current becomes more significant as the frequency becomes higher. The carriers tend to pile up more easily as a driving frequency becomes higher, some implementations described herein minimize and/or suppresses the pileup especially when the driving frequency is high, which may be effective for an EA modulator supporting 56 Gbps, for example.

The electric field strength distributions may also depend on a difference in connection position of the lead-out wire electrode 7. The connection position in a first example analysis example being positions of 3% (frontmost end), 10%, 20%, and 33% (see a fourth example implementation of the present disclosure and FIG. 11), and with a connection position in the comparative example being a position of 50% (center). The other conditions are the same as those described above. Results of 10 GHz, 20 GHz, 40 GHz, and 60 GHz are shown in FIG. 6A, FIG. 6B, FIG. 6C, and FIG. 6D, respectively. The horizontal axis in each figure indicates a position in the optical"axi" direction. A line plotted as "Iph" indicates the photo current obtained when a DC voltage is applied, and corresponds to the axis on the right side. The other plots are electric field strength ratios standardized for the respective connection positions described above with respect to the electric field strength obtained in the case in which the connection position is the position of 50%, and correspond to the axis on the left side.

Figure 6A:
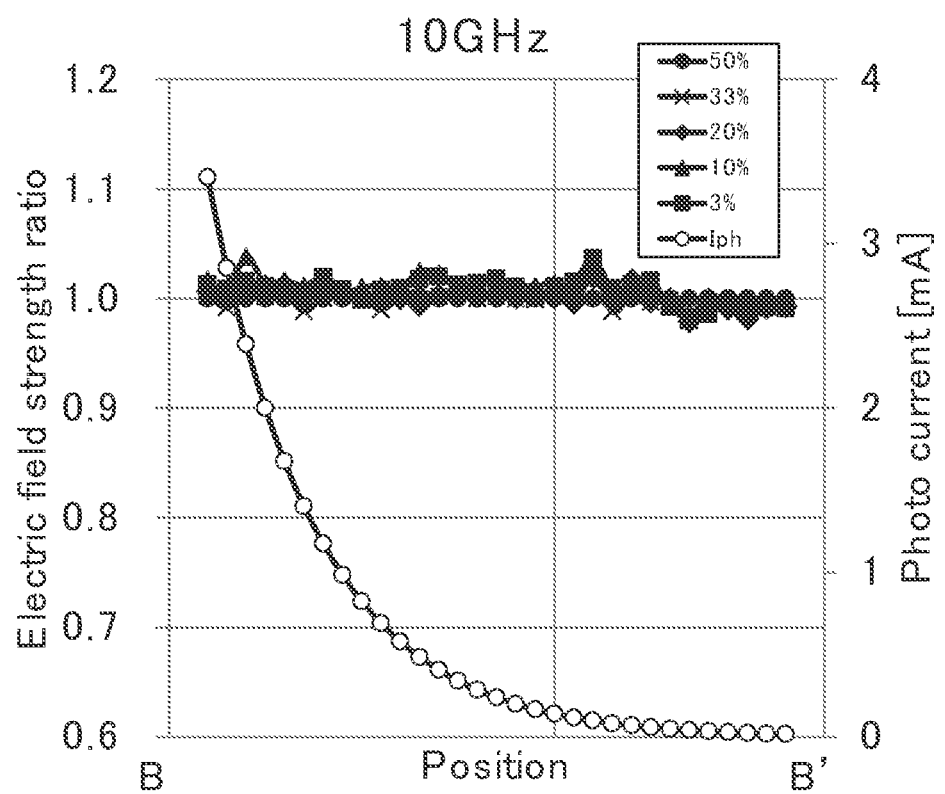
FIG. 6A is a graph showing electric field strength ratios and a photo current distribution at 10 GHz in the optical axis direction.
Figure 6B:
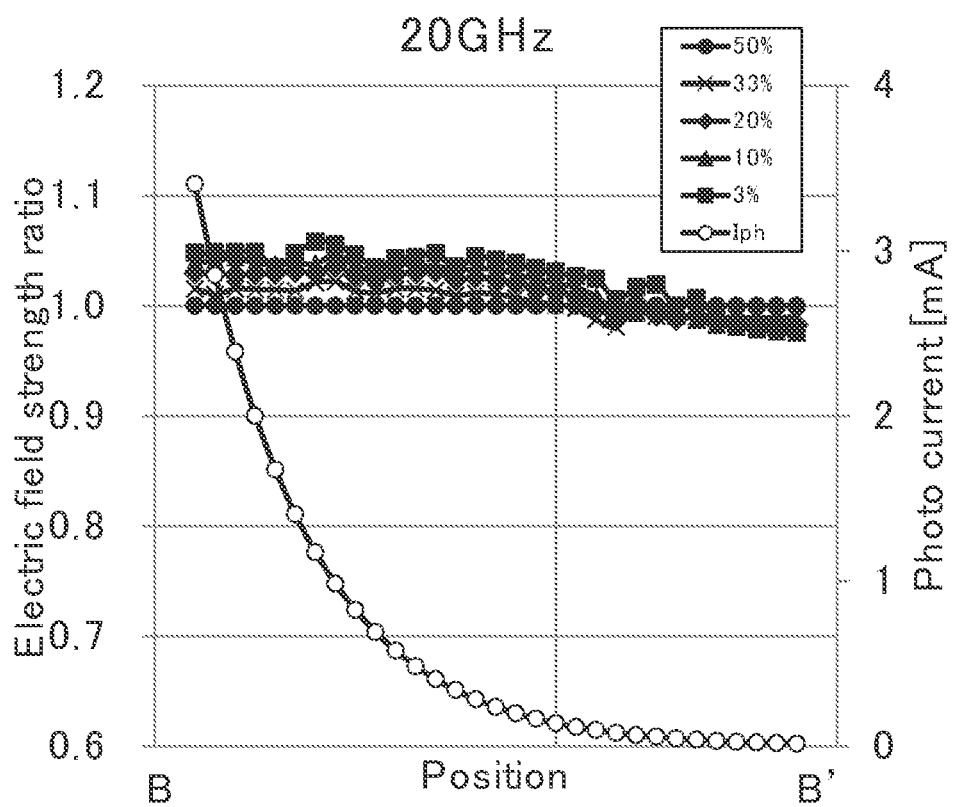
FIG. 6B is a graph showing electric field strength ratios and a photo current distribution at 20 GHz in the optical axis direction.

In the case of the electric signal of 10 GHz shown in FIG. 6A, there may be a tendency that the electric field strength is substantially equal irrespective of the connection position, and is substantially equal at any position in the optical axis direction as compared to the case of the position of 50%. Further, there may be little difference in electric field strength depending on the connection position. In the case of the electric signal of 20 GHz shown in FIG. 6B, there may be a tendency that the electric field strength ratios become higher on the light input end side B, and that the electric field strength ratios become lower on the light output end side B'. This tendency becomes more significant as the frequency becomes higher as is apparent from FIG. 6C of 40 GHz and FIG. 6D of 60 GHz. Further, as a difference depending on the connection position, the electric field strength ratios for the positions of 3%, 10%, and 20%, at which the connection position may be close to the light output end side B', are substantially equal, but the electric field strength ratio for the position of 33% has a small increasing rate depending on the frequency. It can be seen from this result that, when the connection position between the lead-out wire electrode 7 and the mesa-top electrode 6 is set closer to the light output end side B' of a center portion of the mesa-top electrode 6, the electric field strength ratios on the light input end side B can be increased. In particular, when the connection position is moved over to a position of 33% or less, the effects become significant. Further, in order to obtain stable effects in consideration of a manufacturing variation, it may be preferred to move the connection position to a position of 20% or less, at which the electric field strength ratios become substantially equal.

Figure 6C:
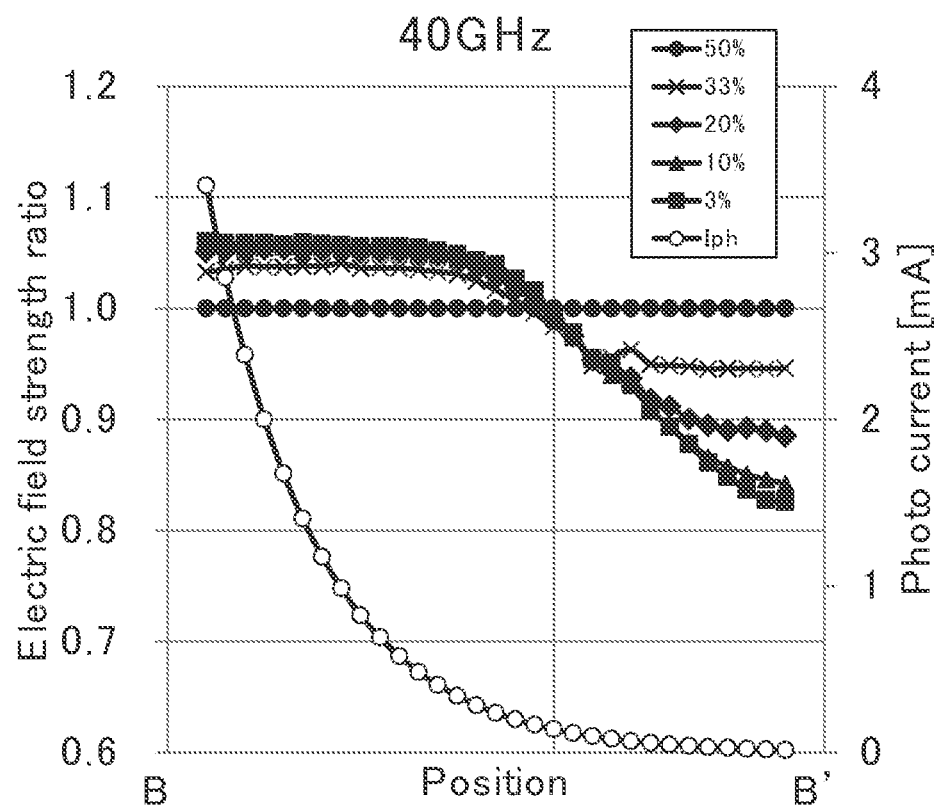
FIG. 6C is a graph for electric field strength ratios and a photo current distribution at 40 GHz in the optical axis direction.
Figure 6D:
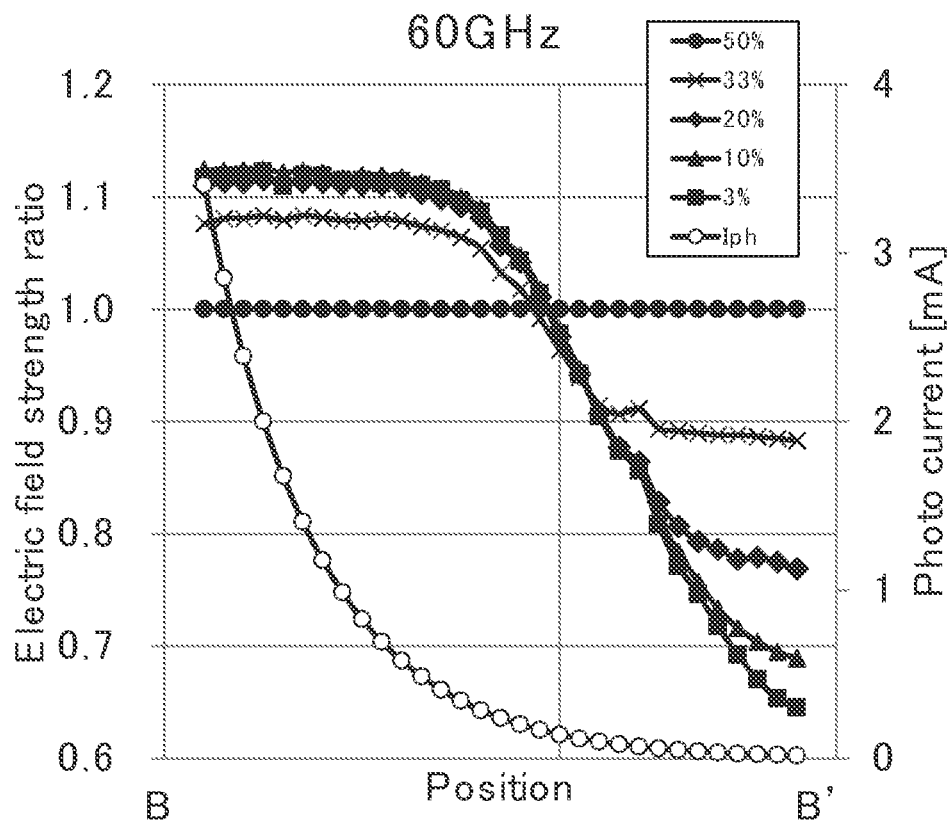
FIG. 6D is a graph showing electric field strength ratios and a photo current distribution at 60 GHz in the optical axis direction.

Irrespective of the connection position, the electric field strength ratios are lower than 1 at positions that are slightly on the light output end side B' side of the center position in the optical axis direction. In a region in which the electric field strength ratios are lower than 1, the electric field strength may be small as compared to the position of 50% in typical configurations, which indicates that extractability for the photogenerated carriers is reduced. For example, as shown in FIG. 6D, the electric field strength ratios become lower than 1 with a certain position being a boundary. The electric field strength ratios being lower than 1 indicates that the electric field strength is small as compared to the structure having the connection position of 50% in typical configurations. The small electric field strength indicates reduced extractability of the photogenerated carriers. Accordingly, in the region in which the electric field strength ratios are lower than 1, the high-frequency characteristics may be reduced as compared to typical configurations. However, as shown in FIG. 6D, the amount of photo current may be not constant from the light input end side B to the light output end side B', and has a distribution of being reduced toward the light output end side B'. A total amount of photo current in a region in which the electric field strength ratios are 1 or more accounts for 95% of a total amount of photo current. Conversely, the amount of photo current in the region in which the electric field strength ratios are less than 1 only accounts for 5% of the total amount of photo current. Even when the electric field strength in the region in which 5% of the total amount of photo current is distributed becomes small as compared to the related-art structure, effects on extractability of the photo current are small. Rather, the effect of increasing the extractability of the photo current (proportional to the photogenerated carriers) by increasing the electric field strength in the region in which 95% of the total amount of photo current is distributed is significant, and the increase in extinction characteristics and the increase in high-frequency characteristics are obtained in total. In other words, the features of the present disclosure reside in that, by shifting the connection position of the lead-out wire electrode 7 from the center portion (50%) of the mesa-top electrode 6 to the light output end side B', the distribution of electric field strengths in the direction along the optical axis of the mesa structure is changed. In typical configurations, the electric field strength in the direction along the optical axis of the mesa structure is substantially constant, but in the present disclosure, while the electric field strength on the light output end side B', on which the photo current is small, is reduced, the electric field strength is increased on the light input end side B, on which the photo current is large. As a result, an EA modulator with an improved high-speed responsivity is provided.

Next, consideration was given to a relationship between a length of the multiple quantum well layer 10, that is, a modulator length Lmod, and the effects of the present disclosure. In order to support high-speed driving at 25 Gbaud or more, it is efficient to reduce the modulator length to reduce a parasitic capacitance. Here, also in consideration of supporting driving at 56 Gbaud or more, analyses are provided for cases in which the modulator length is 100 μm and 125 μm, respectively, in addition to the above-mentioned case in which the modulator length is 150 μm. Further, as in FIG. 6A to FIG. 6D, analyses are provided for each connection position between the lead-out wire electrode 7 and the mesa-top electrode 6. The width of the lead-out wire electrode 7 is not changed.

Figure 7:
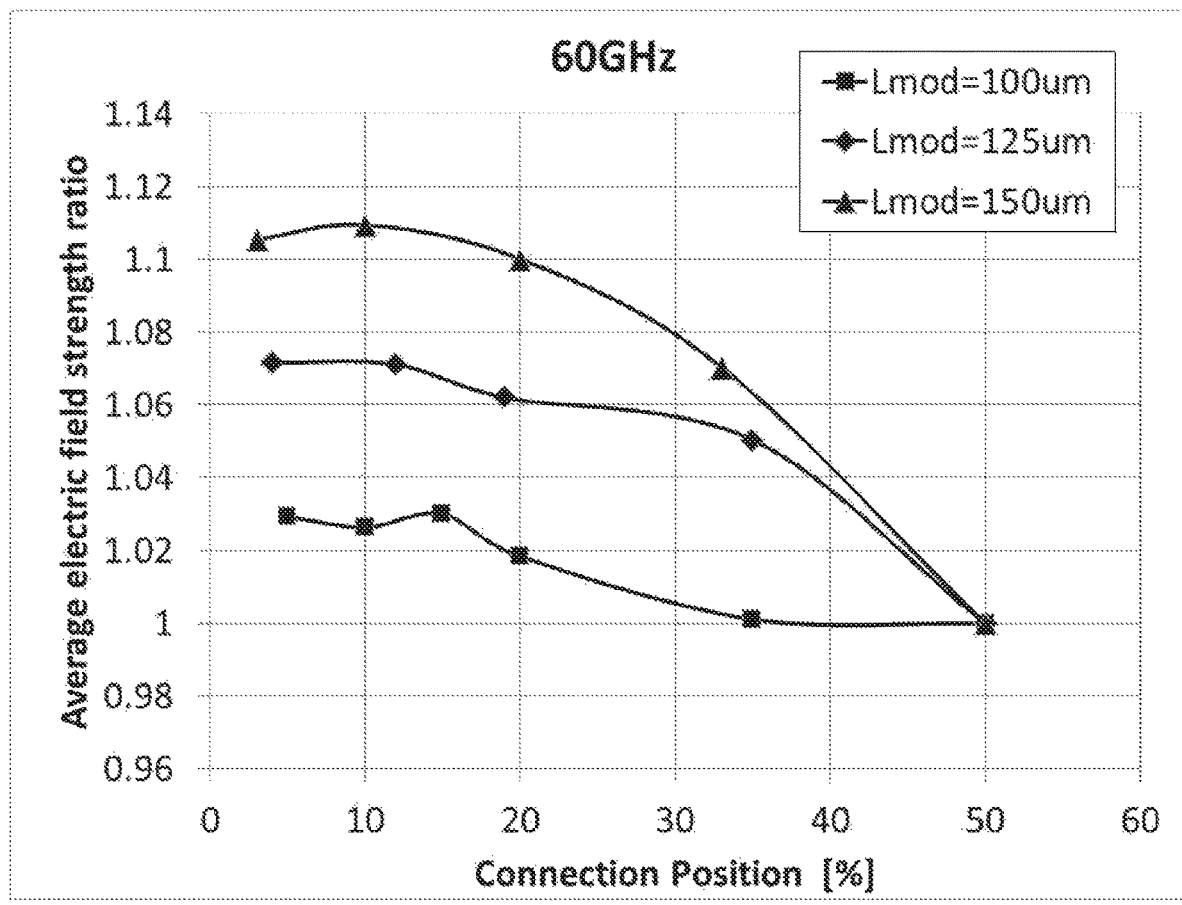
FIG. 7 is a graph showing an average electric field strength ratio for each length of the electro-absorption modulator.

FIG. 7 shows simulation results. In this example, results obtained when an electric signal of 60 GHz is applied are shown. The horizontal axis indicates the connection position of the lead-out wire electrode 7. The vertical axis indicates, as in FIG. 6A to FIG. 6D, electric field strength ratios standardized using as a reference the electric field strength obtained in the case in which the connection position is the position of 50%. Further, as is apparent from FIG. 6A to FIG. 6D, the electric field strength ratios have a distribution at positions in the optical axis direction. Thus, in FIG. 7, an average of the electric field strength ratios in a region which is on the light input end side B of the mesa-top electrode 6, and in which 95% of the total amount of photo current is distributed. As shown in FIG. 7, the effect of increasing the electric field strength may be obtained at any modulator length. Further, the effect becomes more significant as the modulator length becomes longer. Further, the modulator length and the effect of increasing the average electric field strength ratio may be substantially proportional, and, at least in a range in which the modulator length may be 100 μm or more and 150 μm or less, the above-mentioned effect can be obtained by moving the connection position of the lead-out wire electrode 7 over to the light output end side B' side. The effect of increasing the average electric field strength ratio may be small when the connection position of the lead-out wire electrode 7 is 33%, and when the modulator length is 100 μm. In order to obtain the effect of increasing the average electric field strength ratio irrespective of the modulator length, the connection position of the lead-out wire electrode 7 may be 20% or less. Further, when the connection position may be 10% or less, the effect of increasing the average electric field strength ratio may be closer to its peak.

The analysis assumes that the multiple quantum well layer 10 and the mesa-top electrode 6 have the same length, but in reality, the multiple quantum well layer 10 may be slightly longer in consideration of a manufacturing variation. Also in that case, the effects of the present disclosure can be obtained satisfactorily.

Figure 8:
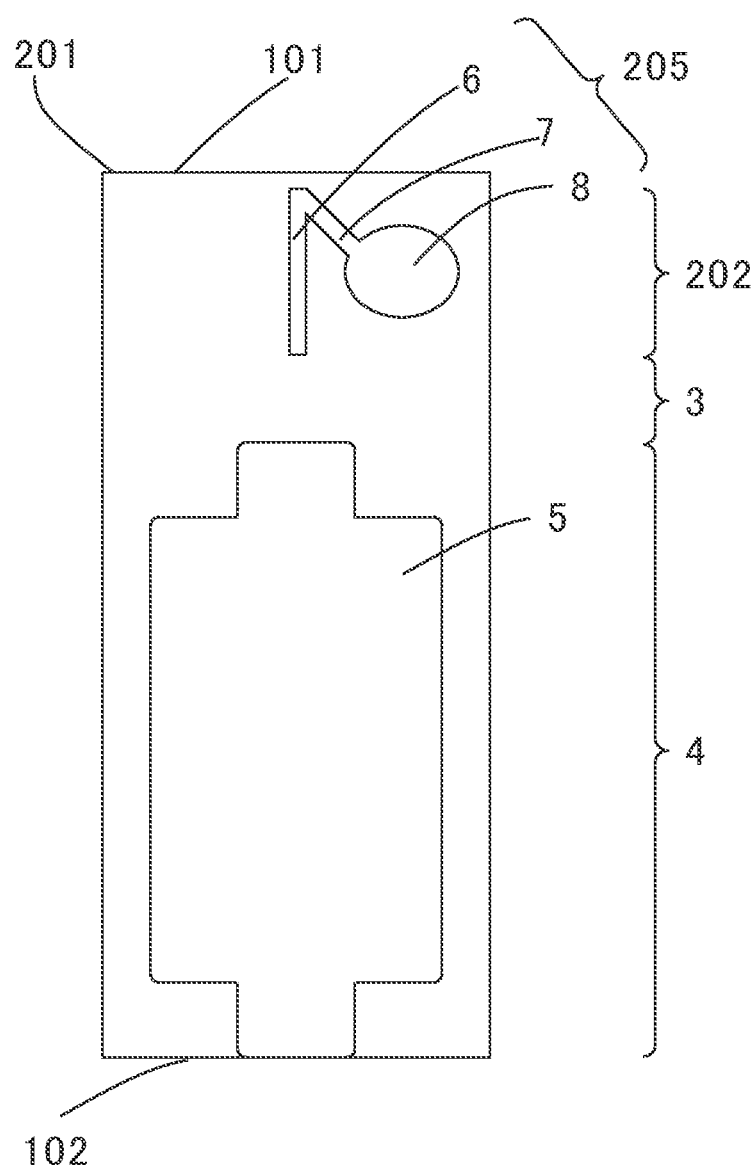
FIG. 8 is a top view of an electro-absorption modulator integrated laser in a second example implementation of the present disclosure.

FIG. 8 is a top view of an electro-absorption modulator integrated laser 201 in a second example implementation of the present disclosure, that is similar to the electro-absorption modulator integrated laser 1 described in the first example implementation may, but may differ in respect to a structure of an EA modulator 202. In the optical axis direction, a center position of the pad electrode 8 may match a center position of the mesa-top electrode 6. The lead-out wire electrode 7 may be inclined at 45° with respect to the optical axis. The mesa-top electrode 6 may have a rectangular shape, and the mesa-top electrode 6 and the lead-out wire electrode 7 may be connected to each other at a position at which a vertex on the upper right of the mesa-top electrode 6 (on the front facet 101 side and the pad electrode 8 side of the mesa-top electrode 6) and a vertex on the upper side of the lead-out wire electrode 7 match. A length of the mesa-top electrode 6 may be 150 μm, and a narrower width of the lead-out wire electrode 7 may be 10 μm. Thus, the center position of the lead-out wire electrode 7 may be connected to a position of about 5% as viewed from the light output end side of the mesa-top electrode 6. A window structure may be provided between the mesa-top electrode 6 and the front facet 101. Effects similar to those of the first example implementation may be obtained with the second example implementation. Further, as compared to the electro-absorption modulator integrated laser 1 described in the first example implementation, the pad electrode 8 may be arranged on an inner side (lower side of FIG. 8) of the device, and hence a length of the entire electro-absorption modulator integrated laser may be reduced. In this example, the lead-out wire electrode 7 may be inclined at 45° with respect to the optical axis, but without limiting thereto, any inclination angle can be adopted. Further, the lead-out wire electrode 7 may not be limited to a straight line, and may be a curved line (see the fourth example implementation). It should be noted, however, that the lead-out wire electrode 7 may become a factor in generating a parasitic capacitance, and hence an area thereof be as small as possible.

Figure 9:
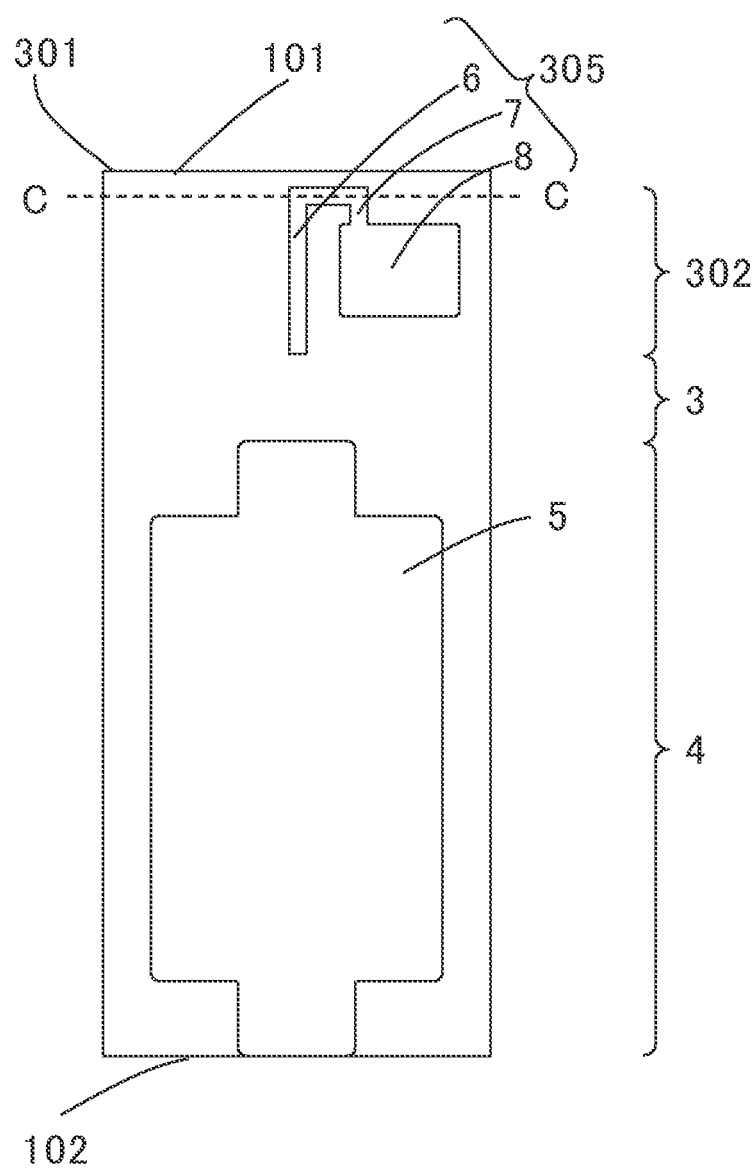
FIG. 9 is a top view of an electro-absorption modulator integrated laser in a third example implementation of the present disclosure.
Figure 10:
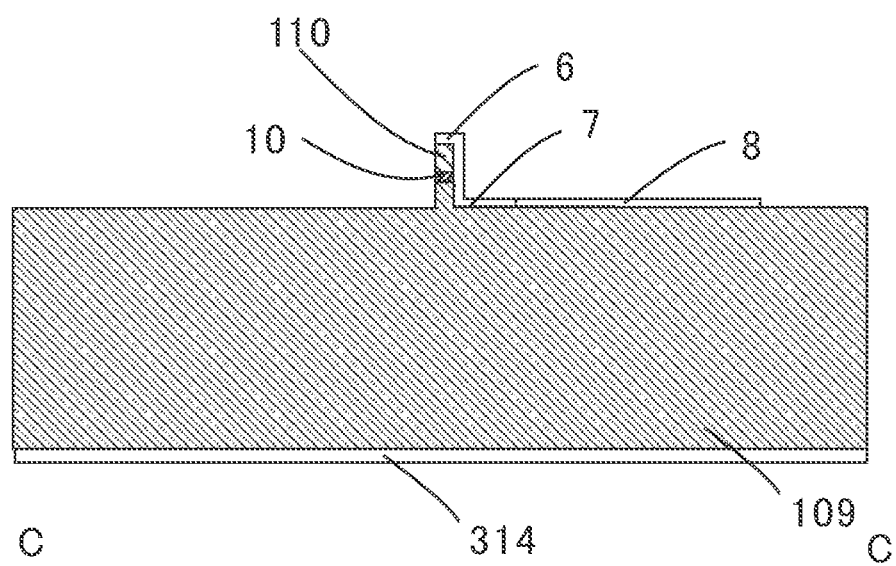
FIG. 10 is a cross-sectional view taken along the line C-C of the electro-absorption modulator illustrated in FIG. 9.

FIG. 9 is a top view of an electro-absorption modulator integrated laser 301 in a third example implementation of the present disclosure. FIG. 10 is a schematic cross-sectional view taken along the line C-C shown in FIG. 9 that is perpendicular to an optical axis of an EA modulator 302. The electro-absorption modulator integrated laser 301 may be similar to the electro-absorption modulator integrated laser 1 described in the first example implementation, but may differ in respect to a structure of the EA modulator 302. In an EA modulator n-type electrode 305, which may be an electrode on a surface side of the EA modulator 302, a mesa-top electrode 6 may be arranged above the mesa structure. Further, the pad electrode 8 may have a rectangular shape. The lead-out wire electrode 7 connects the mesa-top electrode 6 and the pad electrode 8, and may have a substantially L shape. Further, as illustrated in FIG. 10, the lead-out wire electrode 7 may extend up a side surface of the mesa structure and may be connected to the mesa-top electrode 6. An insulating film (not shown) may be arranged between a side portion of the mesa structure and the lead-out wire electrode 7.

As illustrated in FIG. 10, a multilayer structure may be formed of a p-InP substrate 109 (p-type substrate), the multiple quantum well layer 10, and an n-InP cladding layer 110 (n-type cladding layer). On a back surface side on which the mesa structure is not formed, a p-side electrode 314 may be formed. In this example, the p-InP substrate 109 also serves as a p-type cladding layer and the n-InP cladding layer 110 also serves as a contact layer. The mesa structure may be formed of a part of the p-InP substrate 109, the multiple quantum well layer 10, and the n-InP cladding layer 110. In contrast to the EA modulator 2 described in the first example implementation, the buried layer 12 may not be arranged on the side portion of the mesa structure. A minimum configuration is described herein, but an optical confinement layer, a contact layer as a top layer of the mesa structure in order to reduce a resistance, or a passivation film for protecting a semiconductor layer may be arranged as appropriate and as required.

Also in the third example implementation, the lead-out wire electrode 7 may be connected to the light output end side B' side of the center of the mesa-top electrode 6. Also with this configuration, the effect of increasing the electric field strength on the light input end side B, which has been described in the first example implementation, may be obtained. In other words, the effects of the disclosure can be obtained when, in the EA modulator having the p-i-n structure, an EA modulator electrode connected to any one of p-side and n-side semiconductors has the following configuration. Specifically, the EA modulator electrode includes the mesa-top electrode arranged on the mesa structure and the lead-out wire electrode, and the lead-out wire electrode is connected to the light output end side of the mesa-top electrode. Further, with the lead-out wire electrode 7 having the substantially L shape, the lead-out wire electrode 7 may be manufactured by photolithography.

Figure 11:
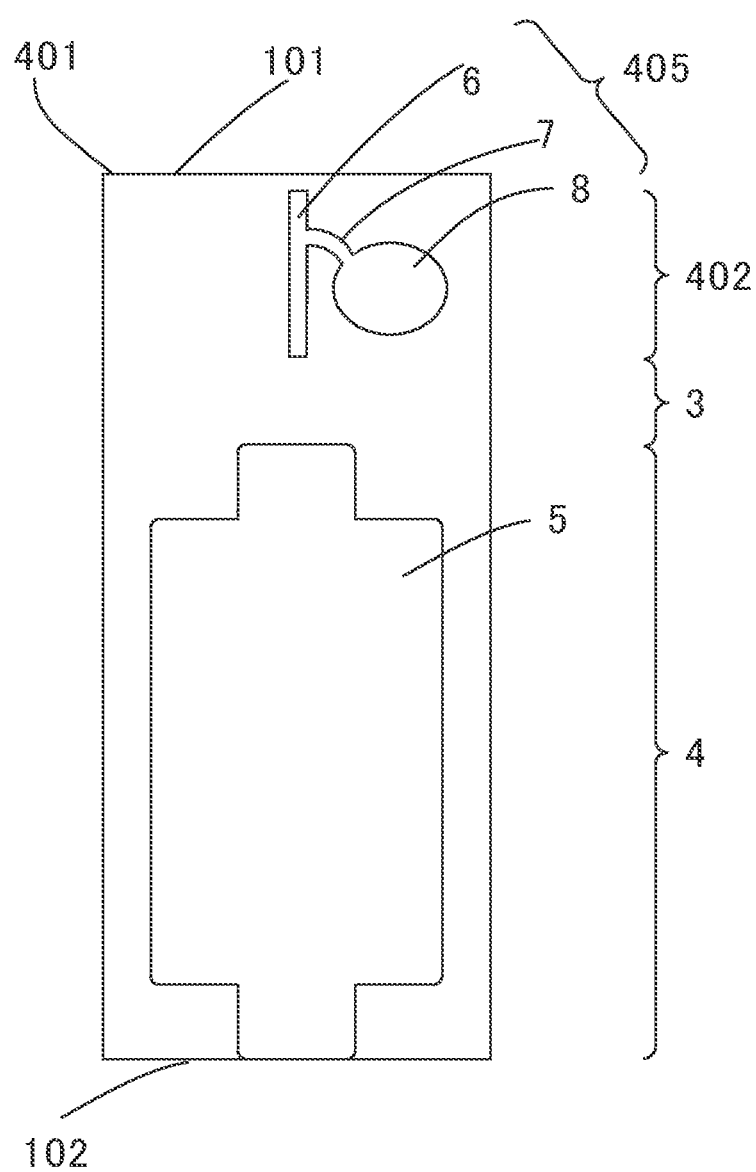
FIG. 11 is a top view of an electro-absorption modulator integrated laser in a fourth example implementation of the present disclosure.

FIG. 11 is a top view of an electro-absorption modulator integrated laser 401 in the fourth example implementation of the present disclosure. The electro-absorption modulator integrated laser 401 may be similar to the electro-absorption modulator integrated laser 1 described in the first example implementation, but may differ in respect to a structure of the EA modulator 402. A lead-out wire electrode 7 of an EA modulator p-side electrode 405 may have a shape that is curved toward the light input end side. A connection position of the lead-out wire electrode 7 may be a position of 33% from the light output end side. A mesa-top electrode 6 of the EA modulator p-side electrode 405 may have a length of 150 μm, and a narrower width of the lead-out wire electrode 7 may be 10 μm. A window structure may be provided between the mesa-top electrode 6 and the front facet 101. It should be understood that, as illustrated in FIG. 6C and FIG. 6D, with this structure, in which the connection position may be 33%, effects similar to those of the first example implementation may be obtained. Further, as compared to the electro-absorption modulator integrated laser 1 described in the first example implementation, the pad electrode 8 may be arranged on an inner side (lower side of FIG. 11) of the device, and hence a length of the entire electro-absorption modulator integrated laser can be reduced. It should be noted, however, that the lead-out wire electrode 7 becomes a factor in generating a parasitic capacitance, and hence an area thereof may be as small as possible.

The present disclosure is not limited to the embodiments described above, and is applicable to EA modulators in general. As long as the lead-out wire electrode is connected not to the center of the mesa-top electrode but to a position shifted toward the light output end side thereof, the electric field strength distribution is changed, and the effect of increasing the bandwidth can be obtained. In other words, irrespective of the shape of the pad electrode or the shape of the lead-out wire electrode, the characteristics can be improved by the connection position to the mesa-top electrode. Further, the p-type and the n-type may be inverted. Still further, the above description has been given of the case in which, when the connection position is the position of 3% from the light output end side, the connection position is the end portion on the light output end side of the mesa-top electrode. However, the percentage is determined depending on the width of the lead-out wire electrode 7 and the length of the mesa-top electrode 6. Thus, as long as an end portion of the lead-out wire electrode 7 and the end portion on the light output end side of the mesa-top electrode 6 match, the percentage is not limited to 3%.

While there have been described what are at present considered to be certain embodiments of the invention, it will be understood that various modifications may be made thereto, and it is intended that the appended claims cover all such modifications as fall within the true spirit and scope of the invention.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may like be interpreted accordingly.

What is claimed is:

1. An electro-absorption modulator, comprising:
    a substrate;
    a mesa structure, which is provided on a first surface of the substrate, and includes a first conductivity type cladding layer, a multiple quantum well layer, and a second conductivity type cladding layer;
    a first conductivity type electrode to be electrically connected to the first conductivity type cladding layer; and
    a second conductivity type electrode provided on a second surface of the substrate, wherein:
        the first conductivity type electrode includes a mesa-top electrode arranged along a direction in which the mesa structure extends, a pad electrode, to which an electric signal from an outside source is to be input, and a lead-out wire electrode, which connects the mesa-top electrode and the pad electrode,
        the mesa structure has a light input end, to which light is to be input from outside, and a light output end, which is on a side of the mesa structure that is opposite of the light input end,
        the mesa-top electrode has a first end closer to the light input end than the light output end and a second end closer to the light output end than the light input end,
        a connection position between a center position in a short-side direction of the lead-out wire electrode and the mesa-top electrode is closer to the second end of the mesa-top electrode than the first end of the mesa-top electrode,
    the connection position is a position that is less than 50% away from the second end of the mesa-top electrode with respect to a length in a long-side direction of the mesa-top electrode.

2. The electro-absorption modulator according to claim 1, wherein the connection position is a position that is 33% or less from the second end of the mesa-top electrode with respect to the length in the long-side direction of the mesa-top electrode.

3. The electro-absorption modulator according to claim 1, wherein the connection position is a position that is 20% or less from the second end of the mesa-top electrode with respect to the length in the long-side direction of the mesa-top electrode.

4. The electro-absorption modulator according to claim 1, wherein the connection position is a position that is 10% or less from the second end of the mesa-top electrode with respect to the length in the long-side direction of the mesa-top electrode.

5. The electro-absorption modulator according to claim 1, wherein the connection position is an end portion on the second end of the mesa-top electrode.

6. The electro-absorption modulator according to claim 1, wherein the multiple quantum well layer has a length in a long-side direction of 100 μm or more and 150 μm or less.

7. The electro-absorption modulator according to claim 1, wherein the lead-out wire electrode is arranged to be perpendicular to the long-side direction of the mesa-top electrode.

8. The electro-absorption modulator according to claim 1, wherein the lead-out wire electrode is arranged to be inclined to the long-side direction of the mesa-top electrode.

9. The electro-absorption modulator according to claim 1, wherein the lead-out wire electrode has a shape that is curved toward the first end of the mesa-top electrode.

10. The electro-absorption modulator according to claim 1, further comprising a buried layer so that the buried layer sandwiches the mesa structure.

11. The electro-absorption modulator according to claim 1, wherein the mesa structure further includes a contact layer on the first conductivity type cladding layer.

\* \* \* \* \*